United States Patent
Strek et al.

(10) Patent No.: US 10,808,915 B2
(45) Date of Patent: Oct. 20, 2020

(54) WHITE LIGHT SOURCE AND METHOD OF WHITE LIGHT GENERATION

(71) Applicant: INSTYTUT NISKICH TEMPERATUR I BADAN STRUKTURALNYCH PAN IM.W.TRZEBIATOWSKIEGO, Wroclaw (PL)

(72) Inventors: Wieslaw Strek, Bielany Wroclawskie (PL); Robert Tomala, Wielun (PL); Lukasz Marciniak, Wroclaw (PL); Dariusz Hreniak, Wroclaw (PL); Yuriy Gerasymchuk, Zmigrod (PL); Bartlomiej Cichy, Wroclaw (PL)

(73) Assignee: INSTYTUT NISKICH TEMPERATUR I BADAN STRUKTURALNYCH PAN IM.W. TRZEBIATOWSKIEGO, Wroclaw (PL)

(*) Notice: Subject to any disclaimer, the term of this patent is extended or adjusted under 35 U.S.C. 154(b) by 408 days.

(21) Appl. No.: 15/776,202

(22) PCT Filed: Nov. 16, 2016

(86) PCT No.: PCT/PL2016/050055
§ 371 (c)(1),
(2) Date: May 15, 2018

(87) PCT Pub. No.: WO2017/086816
PCT Pub. Date: May 26, 2017

(65) Prior Publication Data
US 2020/0256541 A1    Aug. 13, 2020

(30) Foreign Application Priority Data
Nov. 16, 2015 (PL) .......................... 414821

(51) Int. Cl.
*F21V 9/30* (2018.01)
*F21V 13/14* (2006.01)
(Continued)

(52) U.S. Cl.
CPC .............. *F21V 9/30* (2018.02); *C01B 32/182* (2017.08); *C09K 11/65* (2013.01); *F21V 13/14* (2013.01); *F21Y 2115/30* (2016.08)

(58) Field of Classification Search
CPC ... F21K 9/64; F21K 9/69; F21K 2/005; F21V 13/14; F21V 3/061; F21V 9/30;
(Continued)

(56) References Cited

U.S. PATENT DOCUMENTS

| | | | | |
|---|---|---|---|---|
| 3,451,009 A | * | 6/1969 | Ross ...................... | C09K 11/06 372/52 |
| 3,949,319 A | * | 4/1976 | Tofield ................... | H01S 3/094 372/68 |

(Continued)

FOREIGN PATENT DOCUMENTS

| | | |
|---|---|---|
| CN | 204144220 U | 2/2015 |
| CN | 204153509 U | 2/2015 |
| WO | 2013180662 A1 | 12/2013 |

OTHER PUBLICATIONS

Strek W et al: "Infrared laser stimulated broadband white emission of Yb3+:YAG nanoceramics", Optical Materials, vol. 35, No. 11, Sep. 1, 2013 (Sep. 1, 2013), pp. 2013-2017, 5 pgs.
(Continued)

*Primary Examiner* — Isiaka O Akanbi
*Assistant Examiner* — Fatima N Farokhrooz
(74) *Attorney, Agent, or Firm* — Maier & Maier, PLLC

(57) ABSTRACT

A source of white light constructed of a vacuum glass chamber, containing an optically active element, a generator of an IR electromagnetic radiation beam equipped with a
(Continued)

Figure 1:
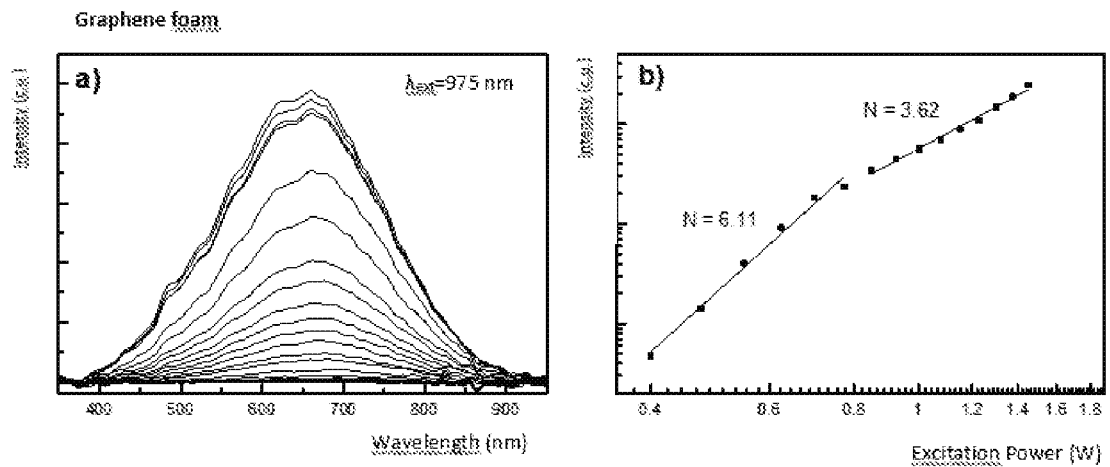

laser IR diode, a battery, a focusing lens, and, optionally, a reflector characterized in that the optically active element contained in the vacuum chamber is a thin layer graphene matrix with the thickness of up to 3 mm Embodiments also relate to a method of white light generation by the above-mentioned white light source.

6 Claims, 3 Drawing Sheets

(51) Int. Cl.
*C09K 11/65* (2006.01)
*C01B 32/182* (2017.01)
*F21Y 115/30* (2016.01)

(58) Field of Classification Search
CPC .... H05B 33/14; C09K 11/7705; C09K 11/65; F21Y 2115/30; Y02B 20/00; C01B 32/182
See application file for complete search history.

(56) References Cited

U.S. PATENT DOCUMENTS

| | | | |
|---|---|---|---|
| 7,088,040 B1* | 8/2006 | Ducharme | F21K 9/64 313/512 |
| 8,317,984 B2* | 11/2012 | Gilje | B82Y 30/00 204/157.47 |
| 8,993,113 B2 | 3/2015 | Pauzauskie et al. | |
| 2010/0155749 A1* | 6/2010 | Chen | C09K 11/703 257/89 |
| 2010/0266964 A1* | 10/2010 | Gilje | C01B 32/192 430/322 |
| 2012/0322917 A1 | 12/2012 | Alcazar Jorba et al. | |
| 2014/0240979 A1* | 8/2014 | Chen | F21V 7/00 362/235 |
| 2015/0071319 A1* | 3/2015 | Xing | H01S 5/36 372/43.01 |
| 2017/0012404 A1* | 1/2017 | Xing | H01S 5/36 |
| 2017/0089526 A1* | 3/2017 | Marciniak | F21K 9/69 |

OTHER PUBLICATIONS

Wieslaw Strek et al: "Laser-induced white-light emission from graphene ceramics-opening a band gap in graphene", Light: Science & Applications, vol. 4, No. 1, Jan. 16, 2015 (Jan. 16, 2015), pp. e237, 8 pgs.

International Search Report and Written Opinion dated Feb. 22, 2017 of corresponding application No. PCT/PL2016/050055, 9 pgs.

* cited by examiner

WHITE LIGHT SOURCE AND METHOD OF WHITE LIGHT GENERATION

The subject of the invention is a source of white light and a method for white light generation.

The prior art includes a few methods for obtaining white light as a result of processes other than emission by a black body, that is incandescence. The methods that are dominant among them are those based on the use of organic luminophores that are excited in the ultraviolet (UV) range and those based on inorganic phosphors blended with ions of rare earth metals.

Graphene is a material that was independently produced for the first time by a group from Georgia (C. Berger, Z. Song, T. Li, X. Li, A. Y. Ogbazghi, R. Feng, Z. Dai, A. N. Marchenkov, E. H. Conrad, P. N. First, W. A. de Heer. "J. Phys. Chem. B". 108, 2004) and from Manchester (K. S. Novoselov, A. K. Geim, S. V. Morozov, D. Jiang, 1 Y. Zhang, S. V. Dubonos, I. V. Grigorieva, A. A. Firsov, "Science". 306, 2004). It is characterized with very good heat conductivity and electrical conductivity, low resistivity and very high electron activity.

After 2010, when the methods for graphene oxide synthesis and its reduction were improved, scientific papers on graphene foams, that is—a porous structure consisting of reduced graphene oxide flakes, appeared. The main area of interest in the application of the above-mentioned foams is their usage as supercapacitors (Patent WO2013180662 A1) and as the anode in lithium ion batteries (Zhou, X., Liu, Z., IOP Conference Series: Materials Science and Engineering, 18 (SYMPOSIUM 3), art. no. 062006.).

Foam graphene is obtained, among others, through pyrolysis of dried gel which is a reaction of graphene oxide, resorcinol, and formalin (M. A. Worsley, P. J. Pauzauskie, T. Y. Olson, J. H. Satcher Jr., T. F. Baumann, Jacs Comm (2010), 10.1021/ja1072299, U.S. Pat. No. 8,993,113 B2), as well as aggregation from aqueous solution (Patent US20120322917 A1).

Light sources using carbon as active material have been known for many years. One of the first sources of this type was an arc lamp created by Humphry Davy in 1802, in which he used two carbon wires between which he produced a 10 cm long electric arc. This was followed by the attempts to use carbon fiber glowing in a vacuum by Jobard (1838) and Swan (1860).

In the article published in Nature Nanotechnology (Nature Nanotechn. 10 (2015) 676) Young Duck Kim et al. describe a light source on a chip which uses graphene. Graphene is placed on a silicic base and heated by means of electric current flowing through the electrodes to the temperature of 2000-2900 K, that is—similar to those used in incandescent light sources. The property of graphene—the fact that its thermal conductivity decreases in high temperatures which prevents damage of the silicic base—is used in the light source.

The method of generation of a broad-range white-light emission by means of excitation with laser lines from 405 nm to 975 nm was described in the article "Laser-Induced White-Light Emission From Graphene Ceramics—Opening a Band Gap in Graphene" (W. Strek, B. Cichy, L. Radosinski, P. Gluchowski, L. Marciniak, M. Lukaszewicz, D. Hreniak, Light: Science & Applications (2015) 4, e237). The phenomenon of white light generation on graphene has threshold nature and the emission intensity is exponentially dependent on the optical excitation power. The temperature of the sample measured during light generation is below 900K which excludes the method of light generation through black body radiation.

The aim of the present invention is providing a source of white light generated by infrared radiation and a method of white light generation.

The essence of the solution according to the invention is a source of white light constructed of a vacuum glass chamber, containing an optically active element, a generator of an IR electromagnetic radiation beam equipped with a laser IR diode, a battery, a focusing lens, and, optionally, a reflector characterized in that the optically active element contained in the vacuum chamber is a thin layer graphene matrix with the thickness of up to 3 mm.

Preferably in the solution according to the invention, the optically active element is a thin layer graphene matrix in the form of graphene powder, graphene ceramics, or graphene foam.

Preferably, after excitation by means of the beam of radiation generated by the laser IR diode, the optically active element emits white light with the color rendering index (CRI) above 96, preferably above 98, more preferably 100. The very high value of color rendering index obtained for the white light source according to the invention prevents distortion in the perception of colors and eye tiredness of the person working under the light using a light source of this type; that is why the light source according to the invention may be used, for example, for workstation lighting.

According to the invention, an IR diode placed in the light source tube emits radiation in the near infrared range with the wavelength of 800-1200 nm, preferably 808-980 nm. Passing through the focusing lens, the radiation beam emitted by the diode excites the optically active element in the form of a graphene matrix, which emits white light after excitation. The graphene material placed in the light source according to the invention shows maximum emission after excitation by electromagnetic wave with the length of 660 nm.

In the solution according to the invention, the optically active element absorbs radiation in the near infrared range thanks to which it is possible to generate broadband radiation, reaching from near ultraviolet range (370 nm) to infrared range (900 nm) with the maximum emission at 660 nm.

Figure 2:
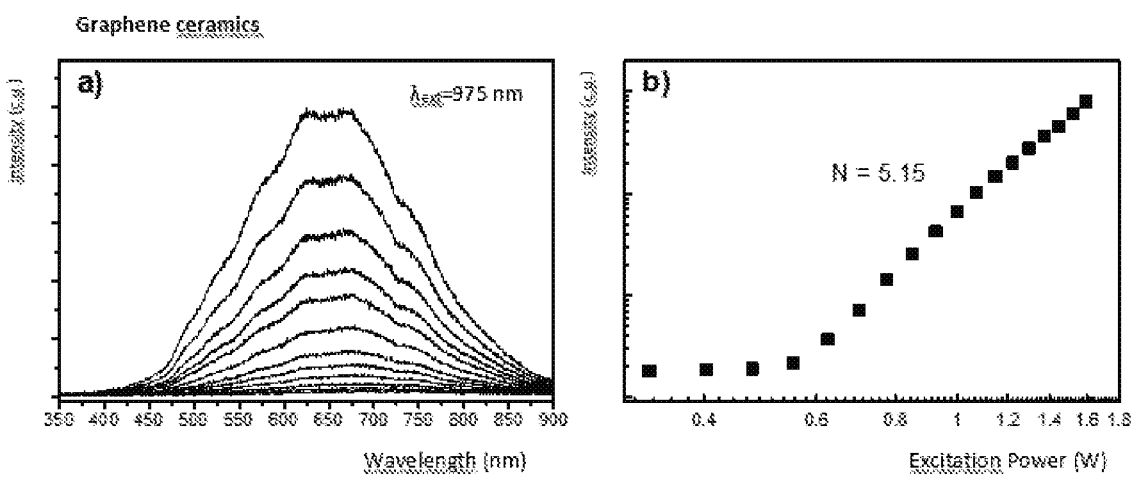
Figure 3:
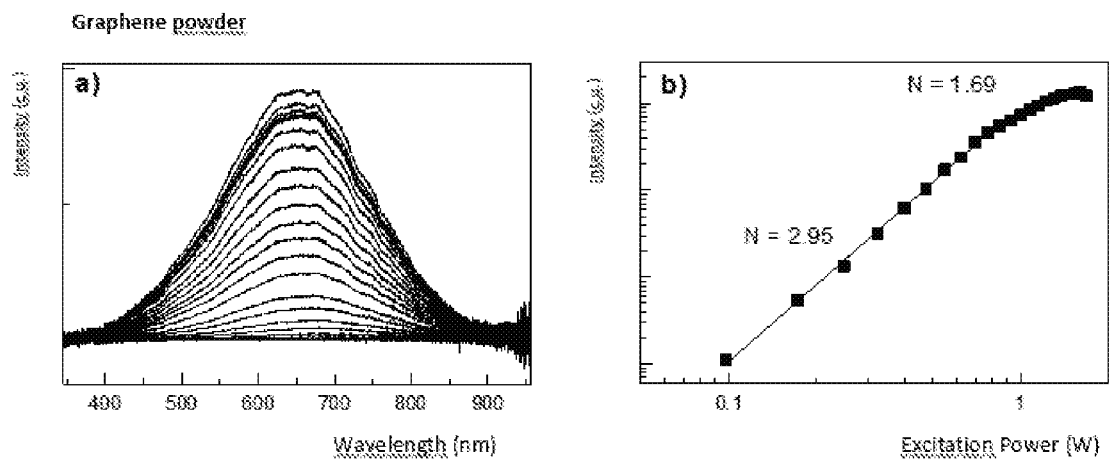

Emission spectra for the light source according to the invention are characterized in that they generate broadband radiation covering the entire visible electromagnetic radiation range with the maximum emission at 660 nm (FIGS. 1*b*, 2*b* and 3*b*). What is more, emission intensity of the light source according to the invention grows exponentially in proportion to the excitation power.

For the light source according to the invention, in which the optically active element is graphene material, low emission threshold has been observed, especially in the case of graphene foam. Apart from that, also high emission intensity and quantum efficiency were observed for the light source according to the invention.

In the solution according to the invention, the intensity of white light emission is controlled by means of optical pumping power or regulation of pressure in the vacuum chamber. For excitation power increase between 0.4-0.8 W, emission intensity of the light source according to the invention increases six times, and for excitation power in the range between 0.9-1.6 W emission intensity of the light source according to the invention increases over three and a half times (FIG. 1*b*).

According to the invention, the intensity of white light emission in the solution according to the invention is in inverse proportion to the pressure of gases surrounding the optically active element; that is why the intensity of white light emission may be controlled by regulation of the pressure of gases surrounding the optically active element. According to the invention, the pressure value in the vacuum chamber containing the optically active element is in the range from $10^0$ to $10^{-6}$ mbar, preferably $10^{-3}$-$10^{-6}$ mbar. Pressure change from 1 mbar to $10^{-3}$ mbar results in the increase in white light emission intensity by three orders of magnitude.

Due to the fact that light emission intensity is strongly dependent on optical pumping density, it is possible to model the emission intensity of the light source according to the invention by differentiation of the distance between the lens and the optically active element. The closer it is to the focal length value, the higher light emission intensity is obtained, e.g. for a lens with the focal length of 3 cm, the difference in emission intensity in the focus and 1 cm behind it is four orders of magnitude.

The subject matter of the invention is also a method of white light generation by means of a white light source constructed of a vacuum glass chamber, containing an optically active element, a generator of an IR electromagnetic radiation beam equipped with a laser IR diode, a battery, a focusing lens, and, optionally, a reflector where the optically active element contained in the vacuum chamber is a thin layer graphene matrix with the thickness of 3 mm. The method according to the invention is characterized in that by means of a generator of an electromagnetic radiation beam, an exciting beam with the wavelength of 800-1200 nm and excitation power of 0.3-0.6 W is generated, after which the exciting beam is passed through the focusing lens and then directed onto the graphene matrix at the angle of 45°-90° in relation to the matrix plane, which, as a result of excitation, emits radiation in the white light range.

In one of the variations of the method according to the invention, where the exciting beam is directed onto the graphene matrix at the angle of 90° in relation to the matrix plane, the beam of radiation in the white light range emitted as a result of graphene matrix excitation is reflected in the reflector which is used to direct the white light beam outside of the device.

Figure 4:
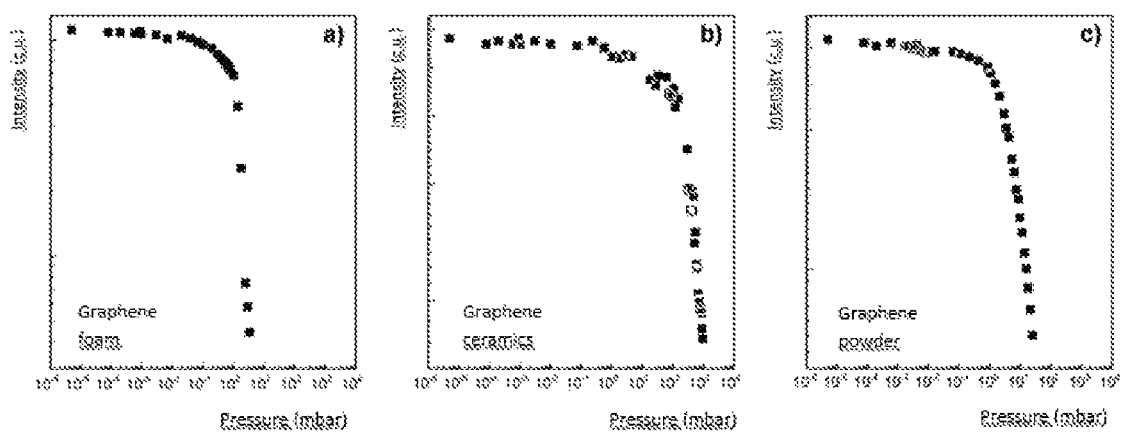
Figure 5:
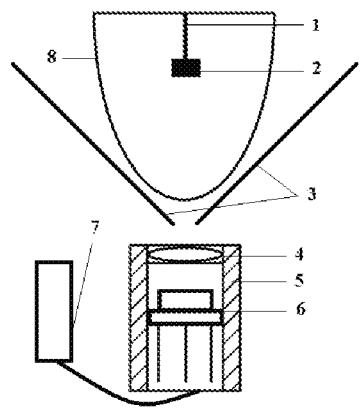

The subject of the invention is shown in the figures, wherein:

FIG. 1a) presents the spectra of a light source emission, where the optically active element is a matrix in the form of graphene foam with the thickness of 3 mm, after excitation by means of electromagnetic wave with the length of 975 nm;

FIG. 1b) presents the dependence between emission intensity and excitation power for a light source, where the optically active element is a matrix in the form of graphene foam with the thickness of 3 mm, after excitation by means of electromagnetic wave between 0.4 W-1.6 W;

FIG. 2a) presents the spectra of a light source emission, where the optically active element is a matrix in the form of graphene ceramics with the thickness of 3 mm, after excitation by means of electromagnetic wave with the length of 975 nm;

FIG. 2b) presents the dependence between emission intensity and excitation power for a light source where the optically active element is a matrix in the form of graphene ceramics with the thickness of 3 mm, after excitation by means of electromagnetic wave between 0.3 W-1.6 W;

FIG. 3a) presents the spectra of a light source emission, where the optically active element is a matrix in the form of graphene powder with thickness of 3 mm, after excitation by means of electromagnetic wave with the length of 975 nm;

FIG. 3b) presents the dependence between emission intensity and excitation power for a light source where the optically active element is a matrix in the form of graphene powder with the thickness of 3 mm, after excitation by means of electromagnetic wave between 0.1 W-1.6 W;

FIG. 4 presents the influence of pressure on the emission intensity of graphene foam (a), graphene ceramics (b) and graphene powder (c) as a result of excitation by a focused beam from an infrared diode. Emission intensity drops rapidly when pressure exceeds the value of $10^{-2}$-$10^0$ mbar;

FIG. 5 presents the construction of a light source according to the invention where the optically active element 2 in the form of graphene material is placed on metal wire 1 inside a vacuum glass chamber 8. The chamber 8 is surrounded by a reflector 3, whose walls are tilted at the angle of 45° in relation to the surface of the optically active element 2. In the lower part of the reflector 3, there is an opening through which the exciting beam of IR electromagnetic radiation is emitted. The generator of the IR electromagnetic radiation beam is an infrared diode 6 placed in a tube 5 powered by a diode battery 7, where the tube 5 is equipped with a lens 4 at one end constituting an exit point of the radiation beam. The exciting electromagnetic IR radiation beam generated by the diode 6 passes through the lens 4, focusing radiation on the optically active element 2, which, as a result of excitation, generates radiation in the white light range. Radiation emission from the optically active element 2 is reflected in a reflector 3, and then it leaves the device.

Figure 6:
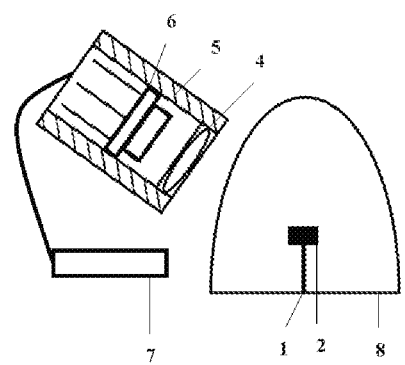

FIG. 6 presents a variant of the light source according to the invention, where the optically active element 2 in the form of graphene material is placed on metal wire 1 inside a vacuum glass chamber 8. Next to the chamber 8, a generator of IR electromagnetic radiation beam in the form of an infrared diode 6 put in a tube 5 powered by a diode battery 7 is placed, where the tube 5 is equipped with a lens 4 at one end constituting an exit point of the radiation beam. The tube 5 is directed towards the optically active element 2 in such a way so as to form the angle of 45° with its surface. The exciting IR electromagnetic radiation beam generated by the diode 6 passes through the lens 4, focusing the radiation, and then falls onto the optically active element 2 at the angle of 45°, which, as a result of excitation, generates radiation in the white light range.

The present solution may find its application in the lighting industry. Thanks to its characteristics, including low power consumption (energy efficiency), as well as its spectral characteristics (wide emission range covering the entire visible radiation range), it can replace fluorescent lamps, LED diodes etc. that are currently used.

The invention is illustrated in more detail in an embodiment that does not limit the scope thereof.

EXAMPLE 1

An optically active element in the form of graphene powder compressed into a tablet with the thickness of 3 mm is placed in a glass chamber. The distance between the lens and the active element is 3 cm, and the pressure in the vacuum chamber is $10^{-6}$ mbar. By means of an IR diode, a beam of electromagnetic radiation with the wavelength of 980 nm is generated and directed by means of a focusing lens onto the graphene matrix at the angle of 45° in relation to the graphene matrix surface. Warm white light with the CRI value of 97 is obtained.

EXAMPLE 2

An optically active element in the form of graphene powder compressed into a tablet with the thickness of 3 mm is placed in a glass chamber. The distance between the lens and the active element is 3 cm, and the pressure in the vacuum chamber is $10^{-6}$ mbar. By means of an IR diode, a beam of electromagnetic radiation with the wavelength of 808 nm is generated and directed by means of a focusing lens onto the graphene matrix at the angle of 45° in relation to the graphene matrix surface. Warm white light with the CRI value of 97 is obtained.

EXAMPLE 3

An optically active element in the form of graphene ceramics with the thickness of 3 mm is placed in a glass chamber. The distance between the lens and the active element in 3 cm, and the pressure in the vacuum chamber is $10^{-6}$ mbar. By means of an IR diode, a beam of electromagnetic radiation with the wavelength of 980 nm is generated and directed by means of a focusing lens onto the graphene matrix at the angle of 45° in relation to the graphene matrix surface. Warm white light with the CRI value of 98 is obtained.

EXAMPLE 4

An optically active element in the form of graphene ceramics with the thickness of 3 mm is placed in a glass chamber. The distance between the lens and the active element in 3 cm, and the pressure in the vacuum chamber is $10^{-6}$ mbar. By means of an IR diode, a beam of electromagnetic radiation with the wavelength of 960 nm is generated and directed by means of a focusing lens onto the graphene matrix at the angle of 45° in relation to the graphene matrix surface. Warm white light with the CRI value of 98 is obtained.

EXAMPLE 5

An optically active element in the form of graphene foam with the thickness of 3 mm is placed in a glass chamber. The distance between the lens and the active element in 3 cm, and the pressure in the vacuum chamber is $10^{-6}$ mbar. By means of an IR diode, a beam of electromagnetic radiation with the wavelength of 960 nm is generated and directed by means of a focusing lens onto the graphene matrix at the angle of 90° in relation to the graphene matrix surface. The white emission beam generated by the graphene matrix as a result of excitation is reflected by the walls of a reflector placed around the vacuum chamber at the angle of 45° in relation to the active element. Warm white light with the CRI value of 100 is obtained.

EXAMPLE 6

An optically active element in the form of graphene foam with the thickness of 3 mm is placed in a glass chamber. The distance between the lens and the active element is 3 cm, and the pressure in the vacuum chamber is $10^{-6}$ mbar. By means of an IR diode, a beam of electromagnetic radiation with the wavelength of 808 nm is generated and directed by means of a focusing lens onto the graphene matrix at the angle of 90° in relation to the graphene matrix surface. The white emission beam generated by the graphene matrix as a result of excitation is reflected by the walls of a reflector placed around the vacuum chamber at the angle of 45° in relation to the active element. Warm white light with the CRI value of 100 is obtained.

The invention claimed is:

1. A white light source comprising:
a vacuum glass chamber containing an optically active element, a generator of an IR electromagnetic radiation beam equipped with a laser IR diode, a battery, a focusing lens, and, a reflector, wherein the optically active element contained in the vacuum chamber is a thin layer graphene matrix with the thickness of up to 3 mm wherein after excitation by means of the beam of radiation generated by the laser IR diode, the optically active element emits white light with the color rendering index (CRI) above 96, wherein the excitation power of 0.3-0.6 W is generated by means of an electromagnetic radiation beam generator, after which the exciting beam is passed through the focusing lens and then directed onto the graphene matrix at the angle of 45-90° in relation to the matrix surface, which, as a result of excitation, emits radiation in the white light range.

2. The white light source according to claim 1, wherein the optically active element is a thin layer graphene matrix in the form of graphene powder, graphene ceramics, or graphene foam.

3. The white light source according to claim 1, wherein the radiation generated by the laser IR diode is in the near infrared range with the wavelength of about 800-1200 nm.

4. The white light source according to claim 1, wherein the pressure value in the vacuum chamber containing the optically active element is in the range from $10^{0}$ to $10^{-6}$ mbar.

5. The method of white light generation by a white light source according to claim 1, wherein an exciting beam with the wavelength in the range of 808-980 nm.

6. A method according to claim 5, wherein the exciting beam is directed onto the graphene matrix at the angle of 90° in relation to the matrix surface, after which the radiation beam in the white light range emitted as a result of graphene matrix excitement is reflected in a reflector which directs the white light beam outside.

* * * * *